(12) United States Patent
Landolt (10) Patent No.: US 7,019,587 B2
(45) Date of Patent: Mar. 28, 2006

(54) FREQUENCY DIVIDER

(75) Inventor: Oliver D. Landolt, Mountain View, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/860,830

(22) Filed: Jun. 4, 2004

(65) Prior Publication Data

US 2005/0270075 A1    Dec. 8, 2005

(51) Int. Cl.
*H03K 25/00* (2006.01)

(52) U.S. Cl. .................. 327/715; 327/117; 377/47

(58) Field of Classification Search ............ 327/115, 327/117; 377/47, 48
See application file for complete search history.

(56) References Cited

U.S. PATENT DOCUMENTS

| 5,003,566 | A |  | 3/1991 | Gabillard et al. |
| 5,163,074 | A |  | 11/1992 | Isobe |
| 6,166,571 | A | * | 12/2000 | Wang ................. 327/115 |
| 6,831,489 | B1 | * | 12/2004 | Cheung et al. ........ 327/115 |

* cited by examiner

Primary Examiner—Dinh T. Le

(57) ABSTRACT

A frequency divider includes a current generator, a transistor and a clock input connected in series. The transistor comprises a gate and has a threshold voltage. The connection between the current generator and the transistor constituting the output of the frequency divider. The frequency divider additionally has a controlled switch connected between the output and the gate. The switch has a control input connected to the clock input. A method for dividing frequency includes providing a current generator, a transistor and a clock input connected in series. In response to a clock pulse supplied when the output is in a high state, charge is transferred from the output to the gate to raise voltage of the gate above the threshold voltage. In response to the clock pulse supplied when the output is low, charge is transferred from the gate to the output to reduce the voltage of the gate below the threshold voltage.

20 Claims, 9 Drawing Sheets

FREQUENCY DIVIDER

BACKGROUND

Frequency dividers, such as divide-by-two frequency dividers, receive a clock input at one frequency and deliver an output signal at half the frequency of the clock input. Frequency dividers are used in such applications as phase-locked loops (PLL) and electronic watches. Typical applications focus on designing the frequency dividers to maximize speed or minimize power consumption.

Optimization of frequency dividers for speed or power consumption results in complex circuits with numerous and large electronic components. Such circuits are unsuitable for use in applications where the physical size of the frequency divider is critical. One example of such an application is a pixel driver for a high-resolution liquid-crystal display (LCD). Each pixel driver is associated with an individual pixel in the LCD and applies an in-phase or counter-phase square wave to each pixel. The number of pixels per unit area of the LCD is inversely proportional to the size of the pixel driver circuit. A driver with numerous electronic components results in areal densities below the current LCD requirement of 10,000 pixels per square inch (about 15 pixel/mm$^2$) and much below the higher resolutions which will be required for the next generation of LCDs.

Figure 1:
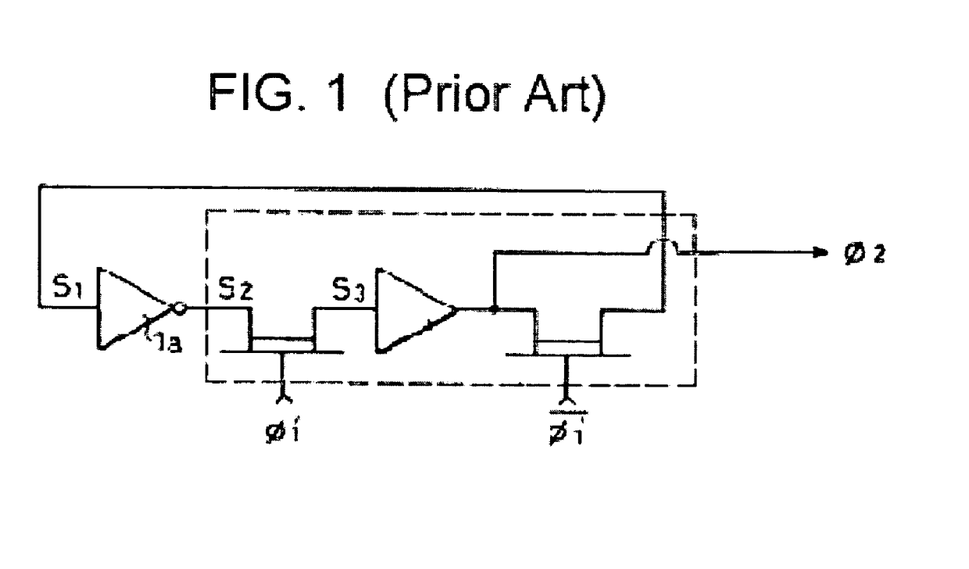
FIGS. 1 and 2 show existing frequency dividers.
Figure 2:
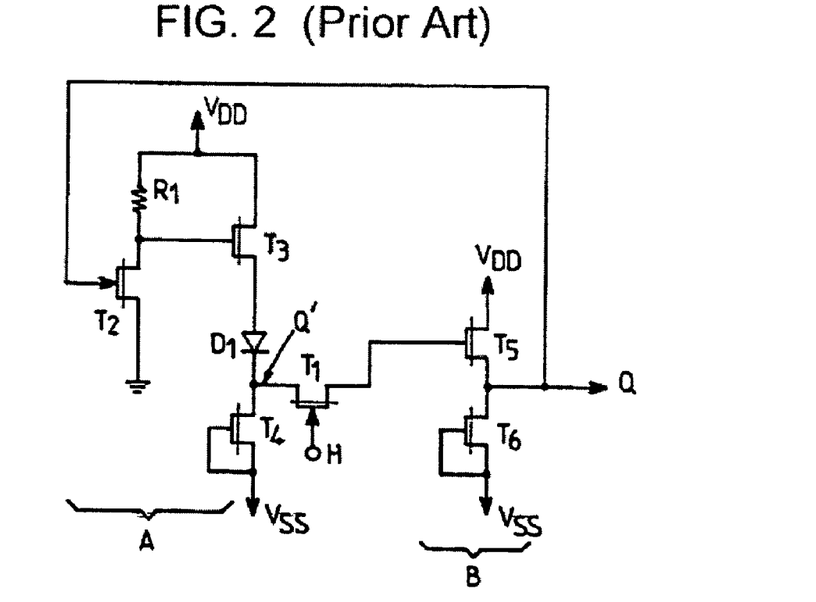

FIGS. 1 and 2 show existing frequency divider circuits. FIG. 1 shows the dynamic frequency divider circuit disclosed in U.S. Pat. No. 5,163,074 to Isobe. The circuit requires at least six transistors. FIG. 2 shows the frequency divider circuit disclosed in U.S. Pat. No. 5,003,566 to Gabillard et al. The circuit requires at least six transistors, plus a diode and a resistor, which are particularly large components.

It would be desirable to have a frequency divider that would overcome the above disadvantages.

SUMMARY

Embodiments of a frequency divider in accordance with the invention use fewer components than conventional frequency dividers, making such embodiments suitable for applications in which space is limited. In the frequency divider, charge is selectively transferred back and forth on alternate clock pulses between the output and gate of a transistor. The charge causes the voltage on the gate to alternate above and below the threshold voltage of the transistor to turn the transistor on and off on the alternate clock pulses. The magnitude of a bias current supplied by a current generator to the output of the frequency divider controls the threshold voltage. The transistor and the current generator constitute an inverter, so the output state is the inverse of the state of the gate.

One aspect of the present invention provides a frequency divider comprising a current generator, a transistor and a clock input connected in series. The transistor comprises a gate and has a threshold voltage. The connection between the current generator and the transistor constitutes the output of the frequency divider. The frequency divider additionally comprises a controlled switch connected between the output and the gate. The switch has a control input connected to the clock input.

Another aspect of the present invention provides a method for dividing frequency. In the method, a current generator, a transistor and a clock input connected in series are provided. The transistor comprises a gate and has a threshold voltage. In response to a clock pulse supplied when the output is high, charge is transferred from the output to the gate to raise a voltage of the gate above the threshold voltage. In response to a clock pulse supplied when the output is low, charge is transferred from the gate to the output to reduce the voltage of the gate below the threshold voltage.

The foregoing and other features and advantages of the invention will become further apparent from the following detailed description, read in conjunction with the accompanying drawings. The detailed description and drawings are merely illustrative of the invention, rather than limiting the scope of the invention being defined by the appended claims and equivalents thereof.

DETAILED DESCRIPTION

The invention is based on the observation that the above-described problems arise from the relatively large number of components used in frequency dividers. Frequency dividers with a large number of components are physically large. This makes it difficult to use such frequency dividers in applications in which size is limited, such as high resolution LCDs. In accordance with the invention, the number of components in the frequency divider is reduced, so the size of the frequency divider is reduced and the frequency divider can be used in applications in which space is limited.

Figure 3:
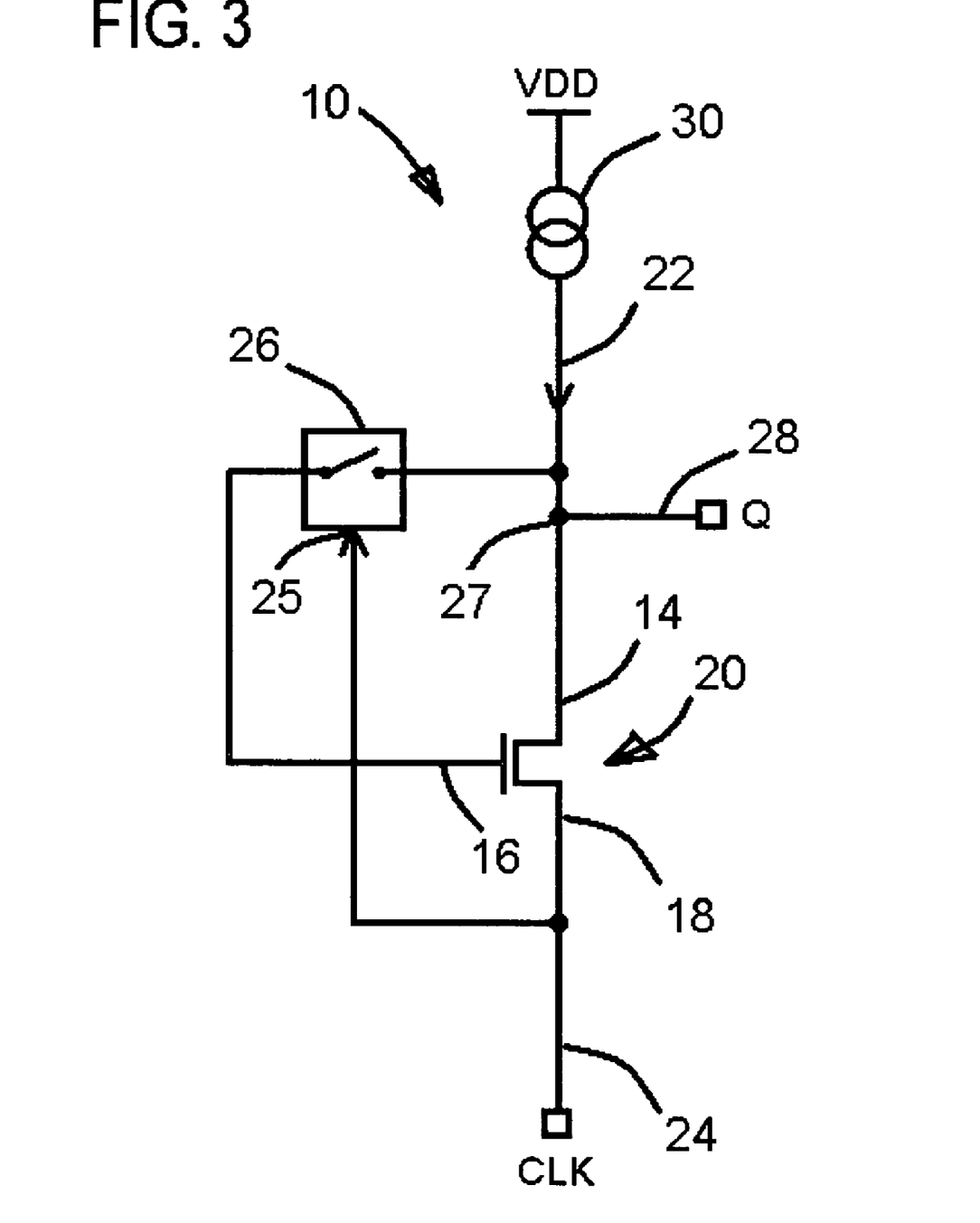
FIG. 3 shows a schematic diagram of an exemplary embodiment of a divide-by-two frequency divider in accordance with the invention.

FIG. 3 shows a schematic diagram of an embodiment of a divide-by-two frequency divider in accordance with the invention. The frequency divider 10 selectively transfers charge back and forth between the output and the gate of a transistor in response to alternate clock pulses to turn the transistor on and off, which changes the state of the output between high and low.

Referring to FIG. 3, a current generator 30, a transistor 20 and a clock input CLK are connected in series. Transistor 20 has a drain 14, a gate 16, and a source 18. Source 18 of transistor 20 is connected to clock input CLK to receive a clock signal 24. Drain 14 of transistor 20 is connected to current generator 30 to receive a bias current 22. A connection 27 between current generator 30 and the drain 14 of transistor 20 constitutes the output of frequency divider 20, and will be referred to herein as output 27. In the example shown, output 27 is connected to an output terminal Q and delivers an output signal 28 to output terminal Q. Output 27 is additionally connected to the gate 16 of transistor 20 through a controlled switch 26. Switch 26 has a control input 25 connected to clock input CLK.

In operation, current generator 30 and transistor 20 act as an inverter. The state of output 27 is the inverse of the state of the gate 16 of transistor 20. Frequency divider 10 changes state by selectively transferring charge back and forth between output 27 to gate 16. The charge transfer is controlled by switch 26. In the example below, the following initial conditions are assumed: clock signal 24 is low; output signal 28 is high; switch 26 is open; and transistor 20 is off. The voltage at the gate 16 of transistor 20 is below the threshold voltage of transistor 20, i.e., the electric charge stored in the gate capacitance of gate 16 generates a voltage insufficient to turn transistor 20 on. Current generator 30 provides a continuous bias current 22.

In this example, the state of clock signal 24 is normally low, and briefly pulses high, i.e., to a level close to supply voltage $V_{DD}$. In this embodiment, the high state of the clock signal 24 is sufficiently brief that the bias current 22 does not add significantly to the charge stored at the gate 16 of transistor 20 during the high state.

Clock signal 24 changes from low to high a first time, which pulls the source 18 of transistor 20 high and closes switch 26. The high state of source 18 prevents transistor 20 from turning on while switch 26 is closed. Output 27 is high, so charge flows through switch 26 to the gate 16 of transistor 20. The charge increases the voltage on gate 16 to a voltage that, when clock signal 24 later returns to its low state, is above the threshold voltage of transistor 20. This voltage will be described herein as "a voltage above the threshold of transistor 20."

Clock signal 24 then changes from high to low a first time, which pulls the source of transistor 20 low and opens switch 26. Opening switch 26 traps electric charge at gate 16. The trapped charge holds the voltage of gate 16 above the threshold voltage of transistor 20, so transistor 20 turns on and pulls drain 14 and output 27 low.

Clock signal 24 next changes from low to high a second time, which pulls source 18 of transistor 20 high and closes switch 26. With its source 18 high, transistor 20 turns off, but drain 14 and output 27 do not immediately go high. Output 27 is low, so the charge trapped at gate 16 flows through switch 26 to output 27. The charge flowing from gate 16 reduces the voltage on gate 16 to a voltage that, when clock signal 24 later returns to its low state, is below the threshold voltage of transistor 20. This voltage will be described herein as "a voltage below the threshold of transistor 20."

Clock signal 24 then changes from high to low a second time, which pulls the source 18 of transistor 20 low and opens switch 26. Opening switch 26 traps electric charge at gate 16. The charge trapped at gate 16 is insufficient to raise the voltage of gate 16 above the threshold voltage of transistor 20, transistor 20 remains off notwithstanding source 18 being low. Current generator 30 pulls drain 14 and output 27 high.

The first time clock signal 24 cycles from low to high to low, output signal 28 on output terminal Q changes from high to low. The second time clock signal 24 cycles from low to high to low, output signal 28 on output terminal Q changes from low to high. Thus, output signal 28 changes state at half the frequency of clock signal 24.

Figure 4:
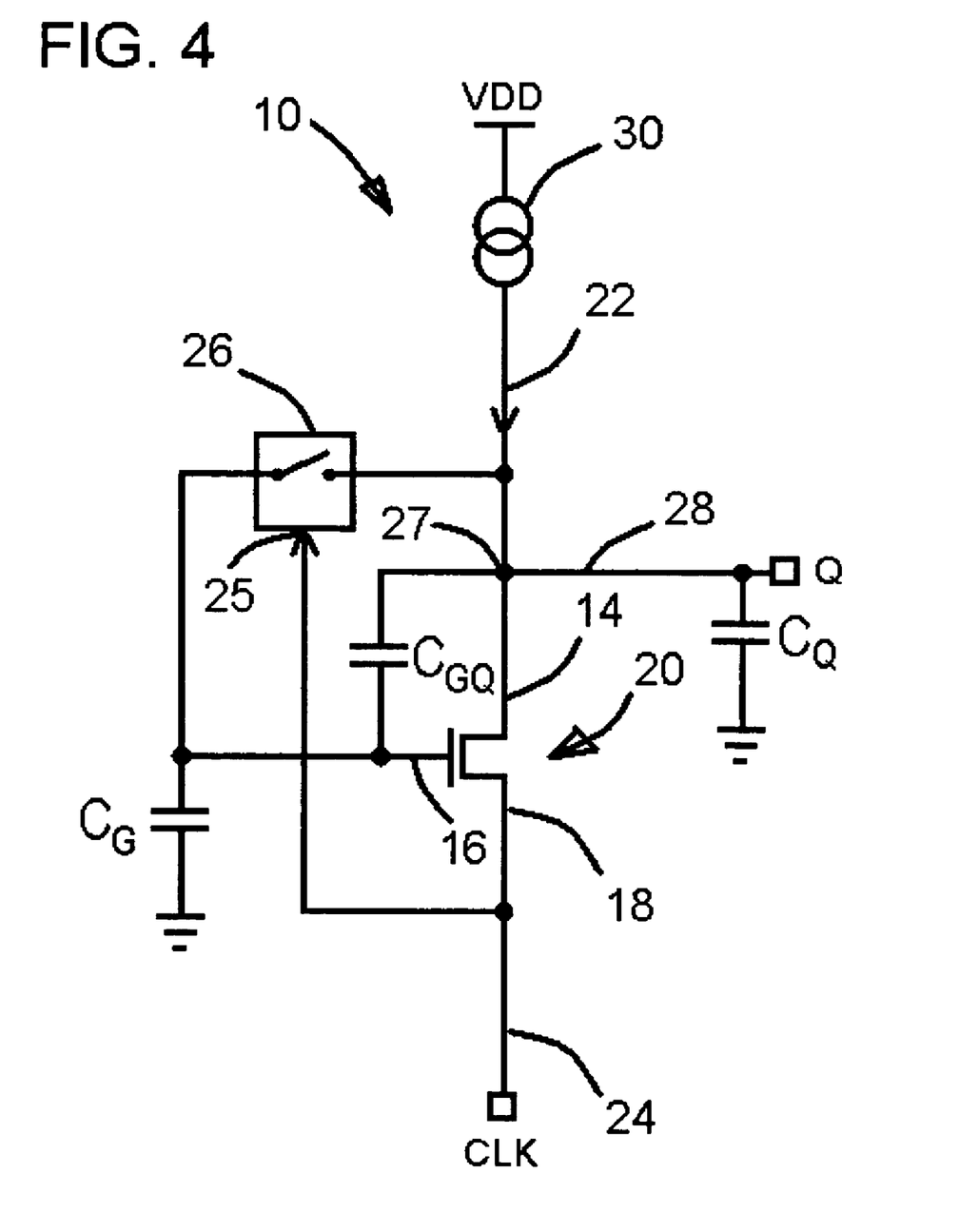
FIG. 4 shows the parasitic capacitances of an exemplary embodiment of a divide-by-two frequency divider in accordance with the invention.

FIG. 4, in which like elements share like reference numbers with FIG. 3, shows the parasitic capacitances of the embodiment of divide-by-two frequency divider 10 shown in FIG. 3. For reliable operation, the charge transferred from output 27 to the gate 16 of transistor 20 during each clock pulse has to be sufficient to cause the gate voltage of transistor 20 to cross the threshold voltage of transistor 20. Small-signal analysis shows that this condition is met if the parasitic output capacitance $C_Q$ on output 27 meets the following condition:

$$C_Q > \sqrt{\frac{C_G C_{GQ}}{2}}$$

where $C_G$ is the parasitic gate capacitance between the gate 16 of transistor 20 and ground, $C_Q$ is the parasitic output capacitance between output 27 and ground, and $C_{GQ}$ is the parasitic feedback capacitance between output 27 and the gate 16 of transistor 20. The characteristics of transistor 20 are specified to satisfy this condition. Metal oxide semiconductor field effect transistors (MOSFETs) typically have inherent parasitic capacitances that satisfy the condition. In an alternative embodiment, an extra load capacitance is connected to output 27 to assure that the above condition is met. The above-described condition is met when the parasitic output capacitance $C_Q$ is much larger than the parasitic gate capacitance $C_{CG}$. This ensures that, when switch 26 is closed to allow charge to be shared between the parasitic output capacitance and the parasitic gate capacitance, the voltage on the parasitic capacitances will be close to the initial voltage on the parasitic output capacitance $C_Q$ and that the voltage on gate 16 will therefore cross the threshold voltage of transistor 20.

In the embodiment shown in FIG. 3, current generator 30 continuously supplies bias current 22 to transistor 20. In one embodiment, current generator 30 is a conventional resistor, such as a carbon resistor, connected between supply voltage $V_{DD}$ and the drain 14 of transistor 20. In an alternative embodiment, current generator 30 is an n-channel field effect transistor, such as a depletion type FET with a low threshold voltage, with its drain connected to supply voltage $V_{DD}$ and its gate and source connected to one another and to the drain 14 of transistor 20. In another alternative embodiment, current generator 30 is a p-channel transistor with its source connected to supply voltage VDD, its drain connected to the drain 14 of transistor 20, and its gate connected to a constant bias voltage source.

Figure 5:
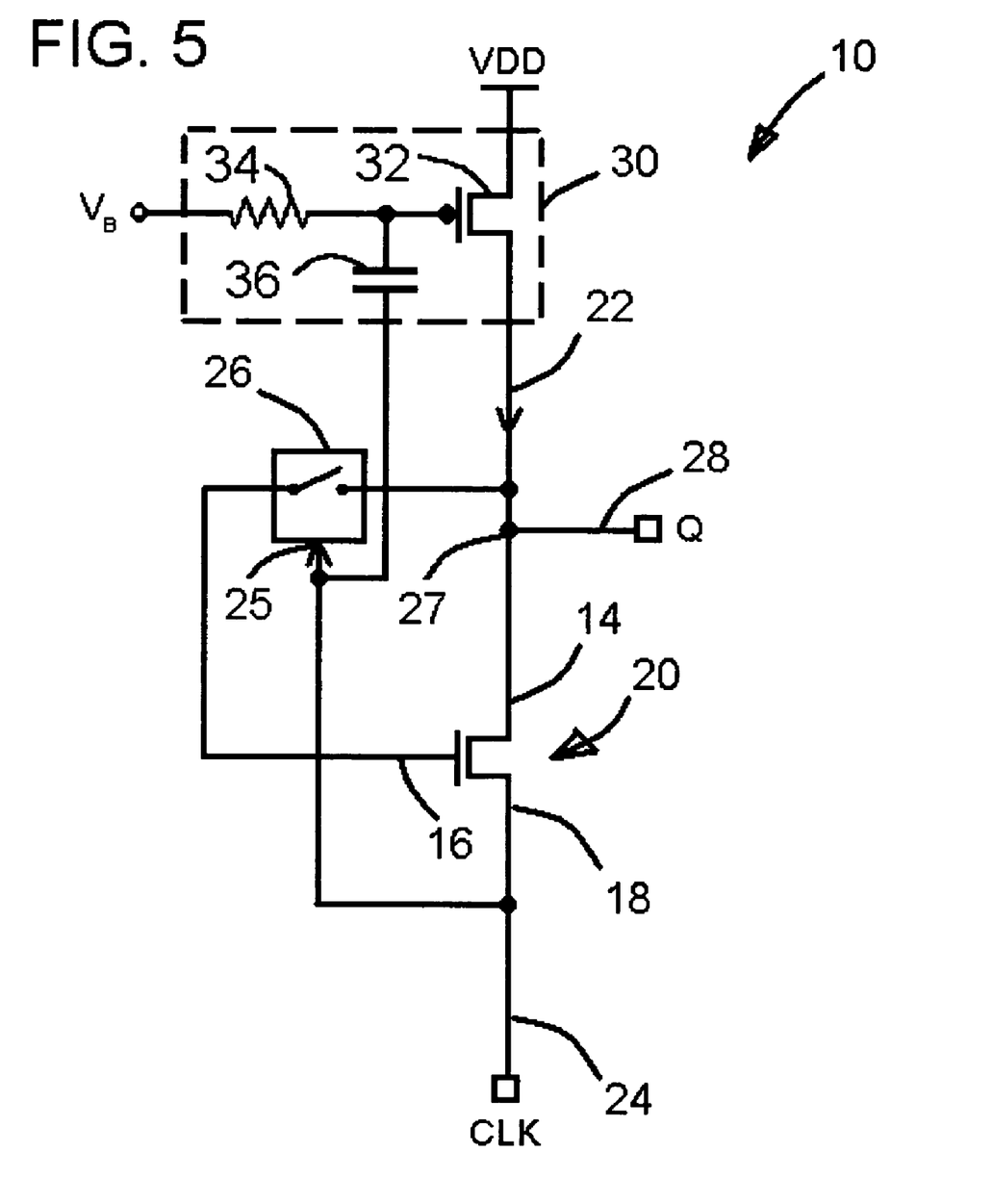
FIG. 5 shows a schematic diagram of another exemplary embodiment of a divide-by-two frequency divider in accordance with the invention.

FIG. 5, in which like elements share like reference numbers with FIG. 3, shows a schematic diagram of another embodiment of a divide-by-two frequency divider in accordance with the invention. In the embodiment of frequency divider 10 shown in FIG. 5, current generator 30 provides a clocked bias current as bias current 22. In such embodiment, bias current 22 changes with time. The clocked bias voltage is synchronized to clock signal 24 and operates to reduce bias current 22 (in some embodiments to zero) when clock signal 24 is high. As noted above, switch 26 is closed when clock signal 24 is high. This embodiment is useful in applications in which the clock signal 24 is high for a time long enough to change the amount of charge trapped at the gate 16 of transistor 20.

In the example shown in FIG. 5, current generator 30 is composed of a p-channel transistor 32 with its source connected to the supply voltage $V_{DD}$, its drain connected to the drain 14 of transistor 20 and its gate connected through a bias resistor 34 to a fixed bias voltage $V_B$ that determines the current output of current generator 30. A coupling capacitor 36 is connected between the clock input CLK and the gate of the p-channel transistor.

Clock signal 24 changing from low to high is coupled by bias capacitor 36 to the gate of p-channel transistor 32 and reduces the gate-to-source voltage of p-channel transistor 32, and, hence the current output of current generator 30. The time constant defined by bias resistor 34 and bias capacitor 36 is typically long compared with the duration of the clock pulses of clock signal 24 to ensure that the gate-to-source voltage of p-channel transistor 32 does increase appreciably during each clock pulse.

In an example of frequency divider 10, transistor 20 is a field effect transistor (FET), such as a metal oxide semiconductor field effect transistor (MOSFET) or a junction field effect transistor (JFET), or a bipolar transistor. Switch 22 is a field effect transistor (FET), such as a metal oxide semiconductor field effect transistor (MOSFET) or a junction field effect transistor (JFET). In embodiments in which transistor 20 is a bipolar transistor, references herein to the gate, source and drain of a field-effect transistor should be taken to refer to the base, emitter and collector, respectively, of the bipolar transistor.

Figure 6:
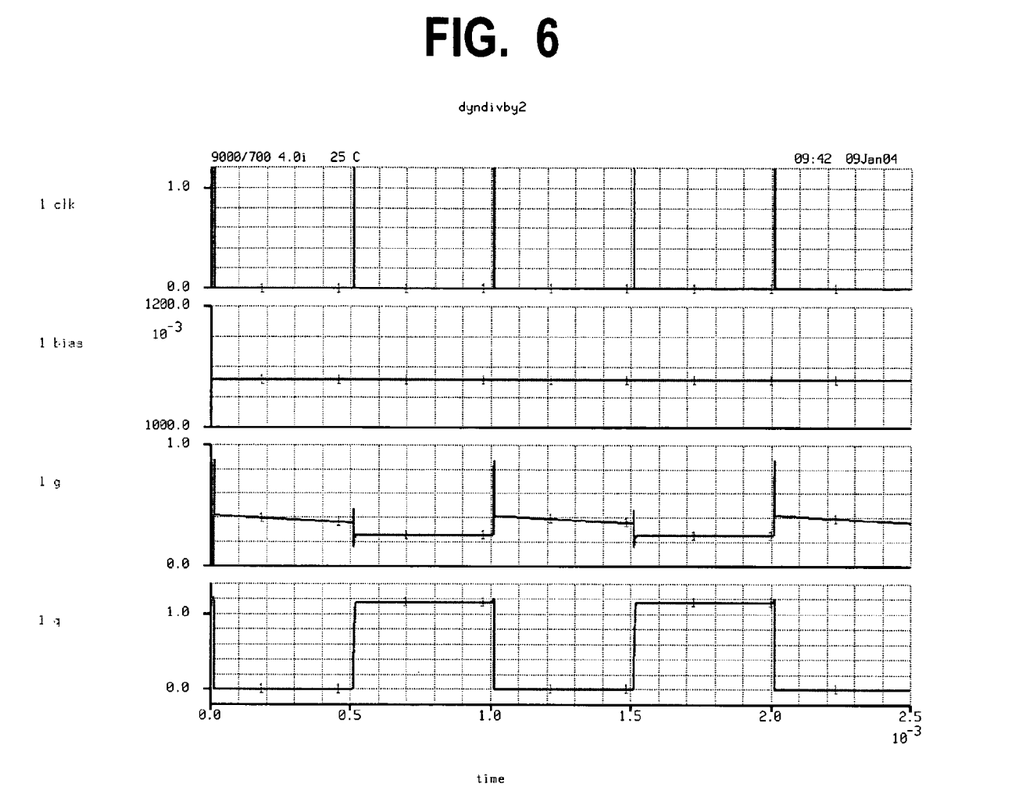
FIGS. 6 and 7 show transient simulations for two different embodiments of a divide-by-two frequency divider in accordance with the invention.
Figure 7:
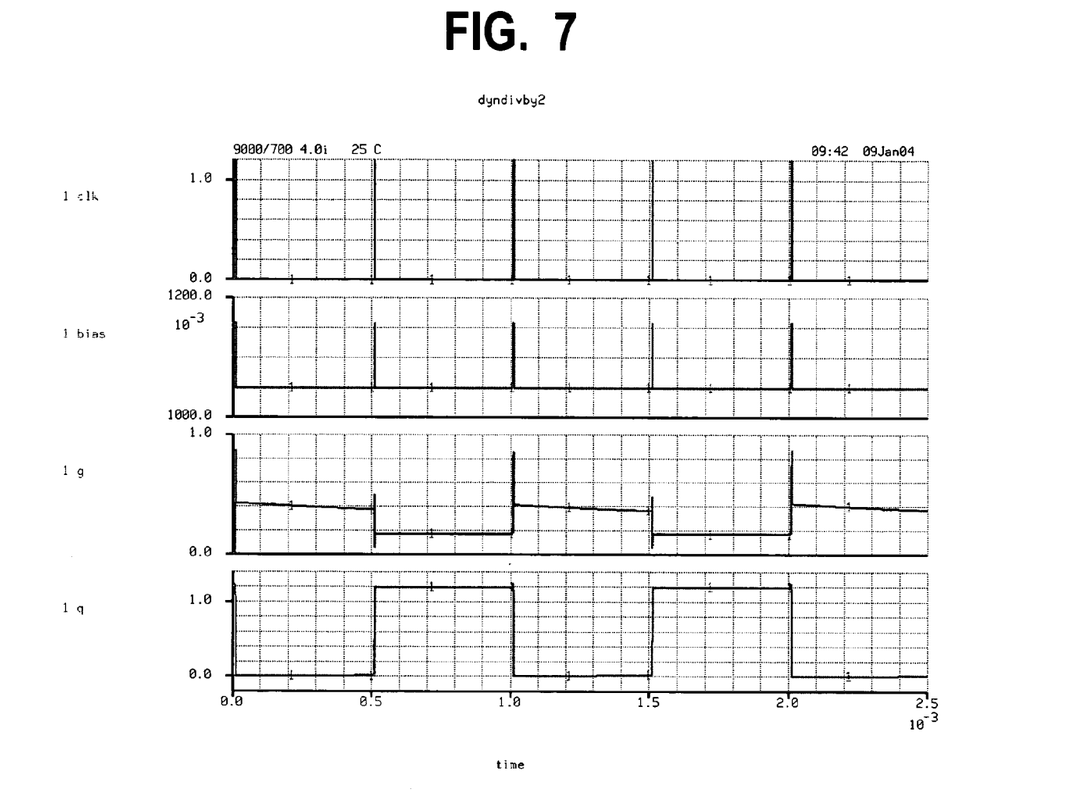

FIGS. 6 and 7 show transient simulations of the embodiments of divide-by-two frequency divider 10 shown in FIGS. 3 and 5, respectively. FIG. 6 shows a transient simulation for an embodiment of frequency divider 10 in which current generator 30 is a constant bias current generator and FIG. 7 shows a transient simulation for an embodiment of frequency divider 10 in which current generator 30 is a clocked bias current generator. The analysis was performed using a SPICE circuit simulation. The process parameters used correspond to a generic 0.13 µm CMOS process. Transistors have an equal channel width and channel length of 0.3 µm. Transistor 20 and switch 26 are n-channel thick-oxide MOSFETs to reduce sub-threshold leakage current through switch 26. Current generator 30 is a p-channel MOSFET with its gate connected to receive a constant bias voltage (FIG. 6) or a clocked bias voltage (FIG. 7).

Referring to FIG. 6, current generator 30 generates a constant bias current 22 of 200 pA. Clock signal 24, labeled as "clk" in FIG. 6, is a series of 1 µs pulses at a frequency of 2 kHz. Output signal 28 at output terminal Q, labeled as "q" in FIG. 6, is a 1 kHz square wave. The bias voltage, labeled as "bias" in FIG. 6, is the constant voltage applied to the gate of the p-channel transistor that constitutes current generator 30 to cause the current generator to generate constant bias current 22 of 200 pA. The voltage at the gate 16 of transistor 20, labeled as "g" in FIG. 6, alternates above and below the threshold voltage of transistor 20 to turn transistor 20 on and off. Transistor 20 turning on and off switches output 27, so the waveform of output signal 28 (labeled "q") is the inverse of the waveform of the voltage on gate 16 (labeled "g"). Output signal 28 changes state every other change in state of clock signal 24, so the circuit operates as a frequency divider.

Referring now to FIG. 7, in which like traces share like labels with the traces shown in FIG. 6, the gate of p-channel transistor 32 (FIG. 5) that constitutes current generator 30 receives a clocked bias voltage to generate a clocked bias current 22. The bias signal, labeled as "bias" in FIG. 6, is a series of 1 µs pulses at a frequency of 2 kHz, synchronous with the pulses of clock signal 24. The resulting bias current 22 is 500 pA when clock signal 24 is low and negligible when clock signal 24 is high.

The embodiment with the clocked bias current shown in FIG. 5 is useful when the pulses of clock signal 24 are long enough in duration for a constant bias current 22 to change the charge trapped at gate 16. Unless bias current 22 is reduced when clock signal 24 is high, bias current 22 increases the charge trapped at gate 16. When trapped charge becomes too high, the voltage on the gate 16 is unable to fall below the threshold voltage of transistor 20, and transistor 20 is unable to turn off. Reducing the bias current 22, typically to zero, when the clock pulses are high prevents the bias current 22 from increasing the charge trapped at gate 16.

The embodiments of frequency divider 10 shown in FIGS. 3 and 5 can only drive a capacitive load. Any resistive component of a load connected to output terminal Q is connected in parallel with current generator 30 and may disrupt operation of the frequency divider.

Figure 8:
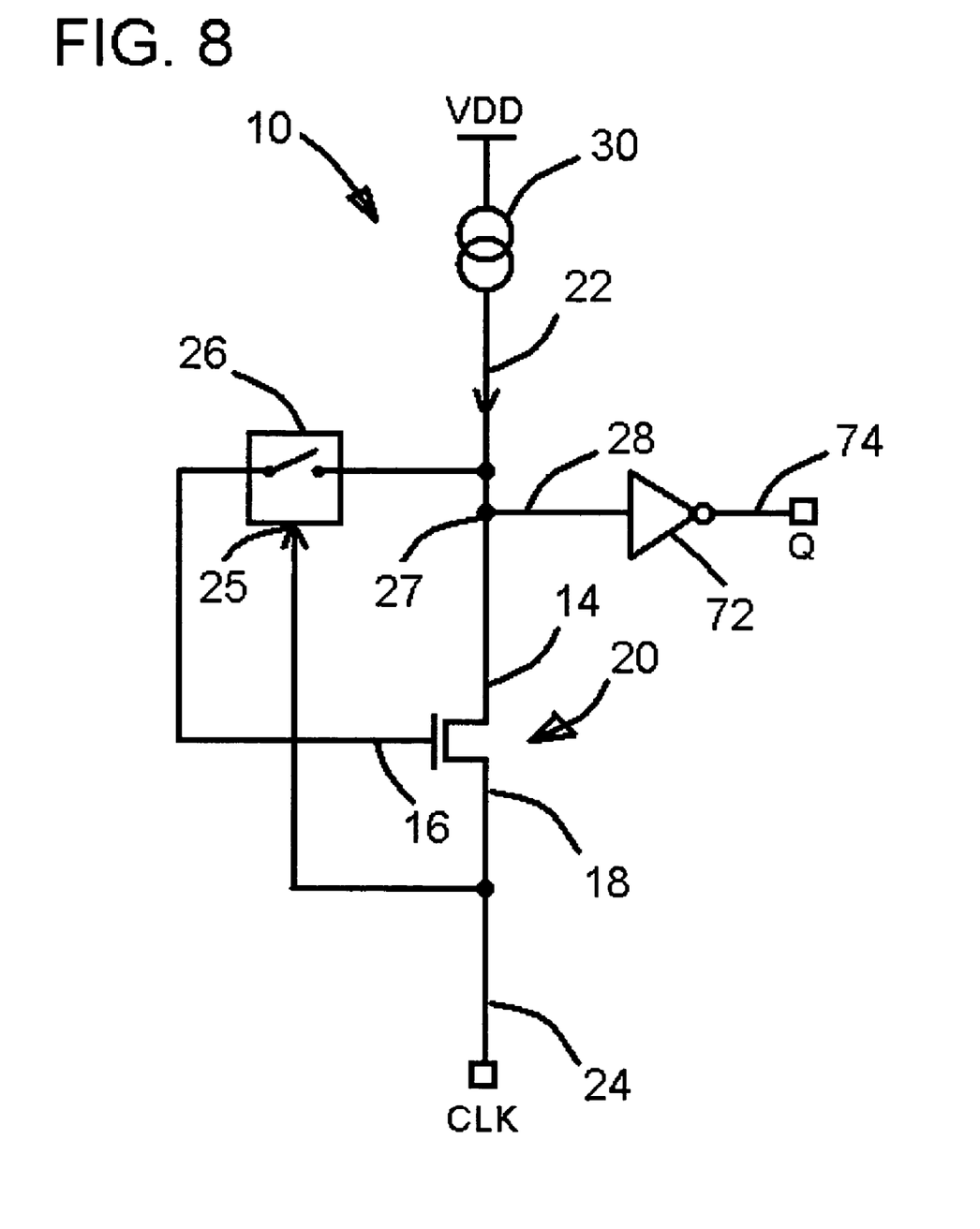
FIG. 8 shows a schematic diagram of an exemplary embodiment of a divide-by-two frequency divider with a buffered output in accordance with the invention.

FIG. 8, in which like elements share like reference numbers with FIG. 3, shows a schematic diagram of an exemplary embodiment of a divide-by-two frequency divider that incorporates an output buffer. An inverter 72 has its input connected to output 27. The output of inverter 72 provides a buffered output signal 74 at output terminal Q. Buffered output signal 74 has cleaner logic states than output signal 28 of the embodiments shown in FIGS. 3 and 5 because inverter 72 conditions output signal 28.

The embodiment of frequency divider 10 shown in FIG. 8 can be used as a frequency divider stage to provide frequency division by a factor greater than two. In each frequency divider stage, inverter 72 provides buffered output signal 74 having well-defined logic states at stage output terminal Q. Stage output terminal Q of one frequency divider stage 10 is connected to the clock input CLK of another frequency divider stage similar to frequency divider stage 10 as clock signal 24 thereof. Two frequency divider stages connected as just described create a divide-by-four frequency divider. Any number of the frequency divider stage can be cascaded in a manner similar to that just described to provide frequency division by a desired factor of two. In such a frequency divider, inverter 72 isolates one frequency divider stage from the next, and prevents leakage currents and parasitic capacitive coupling from causing problems as can occur in some other frequency divider designs. When the number of frequency divisions is sufficient that the duration of the pulses of clock signal 24 becomes long, i.e., when clock signal 24 is in the high state long enough for bias current 22 to affect the charge trapped at gate 16, a frequency divider stage based on the embodiment shown in FIG. 5 is used to prevent bias current 22 from increasing the charge trapped at gate 16.

Figure 9:
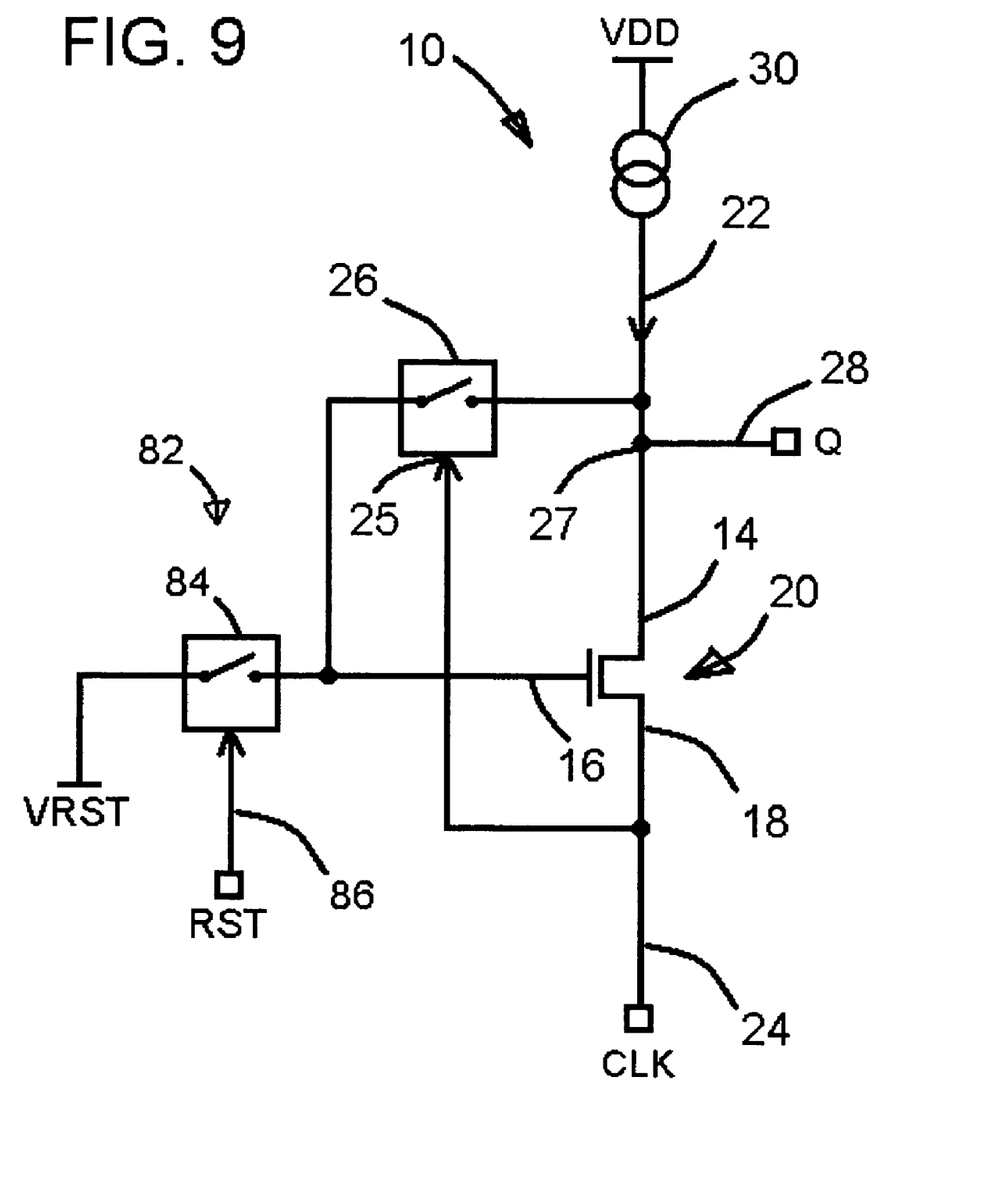
FIGS. 9 and 10 show schematic diagrams of exemplary embodiments of a divide-by-two frequency divider with a reset in accordance with the invention.
Figure 10:
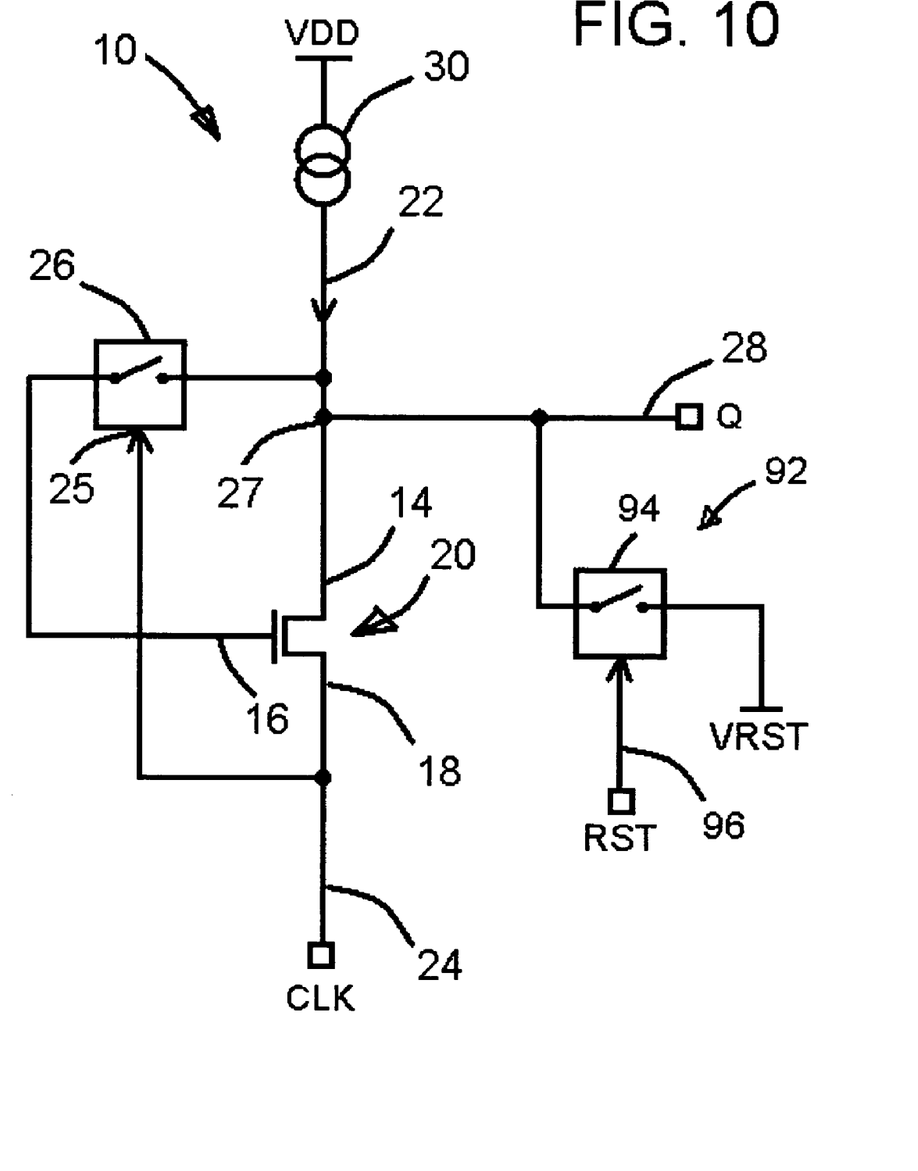

FIGS. 9 and 10, in which like elements share like reference numbers with FIG. 3, show schematic diagrams of embodiments of a divide-by-two frequency divider with reset. The reset is used to set output 27 high or low.

Referring to FIG. 9, a reset circuit 82 is connected to the gate 16 of transistor 20 of frequency divider 10. Reset circuit 82 includes a switch 84 connected between a reset voltage source VRST and gate 16. Switch 84 operates in response to a reset signal 86 to connect reset voltage VRST to gate 16. Reset circuit 82 defines an initial charge state of gate 16. The initial charge state determines whether transistor 20 is off or on after reset signal 86 is de-asserted. The state of transistor 20 determines the state of output 27.

In one embodiment, switch 84 is an n-channel transistor (not shown) with its gate connected to receive reset signal 86, and reset voltage VRST is a low voltage, e.g., ground. When reset signal 86 is asserted, i.e., goes high in this example, the n-channel transistor grounds the gate 16 of transistor 20. This drains the charge from gate 16 and turns transistor 20 off, which sets output 27 high. When reset signal 86 is de-asserted, i.e., goes low in this example, the n-channel transistor turns off, isolating gate 16 from ground. However, gate 16 remains depleted of charge, so transistor 20 remains off, and output 27 remains high.

In an alternative embodiment, switch 84 is a p-channel transistor (not shown) with its gate connected to receive reset signal 86, and reset voltage VRST is a high voltage, e.g., $V_{DD}$. When reset signal 86 is asserted, i.e., goes low in this example, the p-type transistor pulls the gate 16 of transistor 20 high. This transfers charge to gate 16 and turns transistor 20 on, which sets output 27 low. When reset signal 86 is de-asserted, i.e., goes high, the p-channel transistor turns off, isolating gate 16 from the supply $V_{DD}$. Charge remains trapped at gate 16, so transistor 20 remains on, and output 27 remains low.

Referring now to FIG. 10, a reset circuit 92 is connected to output 27 of frequency divider 10. Reset circuit 92 includes a switch 94 connected between a reset voltage VRST and output 27. Switch 94 operates in response to a reset signal 96 to connect output 27 to reset voltage VRST.

When reset signal 96 is asserted in a manner that closes switch 94 and clock signal 24 is high so that switch 26 is also closed, charge flows between the gate 16 of transistor 20 and reset voltage VRST through switch 26. The charge remains at gate 16 when clock signal 24 returns to low and reset signal 96 is de-asserted. The voltage of gate 16 resulting from the flow of charge to or from the reset voltage determines whether transistor 20 turns off or on after reset signal 96 is de-asserted. The state of transistor 20 determines the state of output 27. Connecting the reset circuit to output 27, rather than to the gate 16 of transistor 20 as described above with reference to FIG. 9, avoids current leakage between gate 16 and reset voltage VRST when the reset circuit is inactive.

In one embodiment, switch 94 is an n-channel transistor (not shown) with its gate connected to receive reset signal 96. Reset voltage VRST is a low voltage, e.g., ground. When reset signal 96 is asserted, i.e., goes high in this example, the n-channel transistor connects output 27 to ground. The next time clock signal 24 is high, charge flows through switch 26 from gate 16 to ground, and the voltage on gate 16 falls below the threshold voltage of transistor 20. Accordingly, when reset signal 96 is de-asserted. i.e., goes low in this example, gate 16 remains depleted of charge, transistor 20 turns off and output 27 goes high.

In an alternative embodiment, switch 94 is a p-channel transistor (not shown) with its gate connected to receive reset signal 96. Reset voltage VRST is a high voltage, e.g., $V_{DD}$. When reset signal 96 is asserted, i.e., goes low in this example, the p-type transistor pulls output Q high. The next time clock signal 24 is high, charge flows through switch 26 from the reset voltage to gate 16, and the voltage on gate 16 rises above the threshold voltage of transistor 20. Accordingly, when reset signal 96 is de-asserted, i.e., goes high in this example, the charge trapped at gate 16 turns transistor 20 on, and output 27 goes low.

Embodiments of the invention are described above with reference to exemplary transistor conductivity types and signal and power supply polarities: in other embodiments, the transistor conductivity types and signal and power supply polarities can be reversed.

Changes and modifications to the examples described herein can be made without departing from the scope of the invention. The scope of the invention is indicated in the appended claims, and all changes that come within the meaning and range of equivalents are intended to be embraced therein.

I claim:

1. A frequency divider, comprising:
   a current generator, a transistor, and a clock input connected in series, the transistor comprising a gate and having a threshold voltage, a connection between the current generator and the transistor constituting an output; and
   a controlled switch connected between the gate and the output, the switch having a control input connected to the clock input.

2. The frequency divider of claim 1, in which the switch comprises a filed-effect transistor.

3. The frequency divider of claim 2, in which the switch comprises one of a metal-oxide-semiconductor field effect transistor and a junction field effect transistor.

4. The frequency divider of claim 1, in which the transistor is one of a metal-oxide-semiconductor field effect transistor, a junction field effect transistor and a bipolar transistor.

5. The frequency divider of claim 1, in which:
   the transistor is a first transistor; and
   the current generator comprises a second transistor comprising a gate, and a bias voltage to which the gate of the second transistor is connected.

6. The frequency divider of claim 5, in which the bias voltage is constant.

7. The frequency divider of claim 5, in which the bias voltage is clocked.

8. The frequency divider of claim 7, in which the bias voltage clocking is synchronized with a clock signal applied to the clock input.

9. The frequency divider of claim 5, in which the second transistor is opposite in conductivity type to the first transistor.

10. The frequency divider of claim 1, in which the current generator comprises a resistor.

11. The frequency divider of claim 10, in which:
    the transistor is a first transistor; and
    the resistor comprises a second transistor comprising a source, a gate, and a drain, the drain connected to a supply voltage, the gate connected to the source and the source connected to the output.

12. The frequency divider of claim 1, additionally comprising an inverter connected to the output.

13. The frequency divider of claim 1, additionally comprising a reset circuit connected to the transistor.

14. The frequency divider of claim 13, in which the reset circuit comprises:
    a reset input; and
    a second controlled switch connected between the transistor and a reset voltage, the second controlled switch having a second control input connected to the reset input.

15. The frequency divider of claim 14, in which the reset voltage is one of ground and a supply voltage.

16. The frequency divider of claim 14, in which the second controlled switch is connected to one of the gate of the transistor and the output.

17. The frequency divider of claim 1, in which the controlled switch operates in response to clock pulses applied thereto, ones of the clock pulses applied when the output is a high state causing the controlled switch to transfer charge from the output to the gate to raise a voltage at the gate above the threshold voltage with a first polarity, ones of the clock pulses applied when the output is in a low state causing the controlled switch to transfer charge from the gate to the output to reduce the voltage at the gate below the threshold voltage.

18. A method for dividing frequency, the method comprising:
provide a current generator, a transistor and a clock input connected in series, the transistor comprising a gate and having a threshold voltage, a connection between the current generator and the transistor constituting an output;
applying clock pulses to the clock input;
in response to ones of the clock pulses applied when the output is in a high state, transferring charge from the output to the gate to raise a voltage of the gate above the threshold voltage; and
in response to ones of the clock pulses applied when the output is in a low state, transferring charge from the gate to the output to reduce the voltage of the gate below the threshold voltage.

19. The method of claim 18, additionally comprising buffering the output.

20. The system of claim 18, additionally comprising applying a reset voltage to the transistor to set the output to one of a high state and a low state.

* * * * *

UNITED STATES PATENT AND TRADEMARK OFFICE
CERTIFICATE OF CORRECTION

| | | |
|---|---|---|
| PATENT NO. | : 7,019,587 B2 | Page 1 of 1 |
| APPLICATION NO. | : 10/860830 | |
| DATED | : March 28, 2006 | |
| INVENTOR(S) | : Landolt | |

It is certified that error appears in the above-identified patent and that said Letters Patent is hereby corrected as shown below:

In column 8, line 61, after "output is" insert -- in --.

Signed and Sealed this

Twenty-fifth Day of July, 2006

JON W. DUDAS
*Director of the United States Patent and Trademark Office*